US012787644B2

(12) United States Patent
Choi

(10) Patent No.: US 12,787,644 B2
(45) Date of Patent: Nov. 3, 2026

(54) METHOD OF PERMANENTLY PHASE-TRANSITING SEMIMETAL USING ION IMPLANTATION AND SEMIMETAL PHASE-TRANSITED THEREBY

(71) Applicant: UNIVERSITY—INDUSTRY COOPERATION GROUP OF KYUNG HEE UNIVERSITY, Yongin-si (KR)

(72) Inventor: Suk Ho Choi, Suwon-si (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 1332 days.

(21) Appl. No.: 17/574,938

(22) Filed: Jan. 13, 2022

(65) Prior Publication Data

US 2022/0223365 A1 Jul. 14, 2022

(30) Foreign Application Priority Data

Jan. 14, 2021 (KR) ........................ 10-2021-0005347

(51) Int. Cl.

| | |
|---|---|
| ***C01G 29/00*** | (2006.01) |
| ***C30B 29/52*** | (2006.01) |
| ***H01J 37/08*** | (2006.01) |
| ***H01J 37/32*** | (2006.01) |
| ***H10D 62/80*** | (2025.01) |
| ***H10N 10/853*** | (2023.01) |
| ***H10N 52/01*** | (2023.01) |

(Continued)

(52) U.S. Cl.
CPC ........... *H10N 10/853* (2023.02); *C01G 29/00* (2013.01); *C30B 29/52* (2013.01); *H01J 37/08* (2013.01); *H01J 37/32412* (2013.01); *H01J 37/32532* (2013.01); *H10D 62/882* (2025.01); *H10N 52/01* (2023.02); *H10N 60/85* (2023.02); *H10P 30/20* (2026.01); *C01P 2002/20* (2013.01); *C01P 2002/30* (2013.01); *C01P 2002/82* (2013.01); *C01P 2002/90* (2013.01); *Y10S 505/729* (2013.01); *Y10S 505/742* (2013.01); *Y10S 505/775* (2013.01)

(58) Field of Classification Search
CPC ......... C22C 12/00; C22C 24/00; C22C 28/00; C01G 29/00; C01G 29/006; C01G 30/00; C01G 30/002; C01P 2002/82; C01P 2002/90
See application file for complete search history.

(56) References Cited

FOREIGN PATENT DOCUMENTS

| | | |
|---|---|---|
| KR | 10-2007-0055674 A | 5/2007 |
| KR | 10-2020-0060676 A | 6/2020 |

OTHER PUBLICATIONS

V.K. Maurya, Manju Mishra Patidar, Anita Dhaka, R. Rawat, V. Ganesan, R.S. Dhaka, "Magnetotransport and Berry phase in magnetically doped Bi(0.97-x)Sb(0.03) single crystals," Physical Review B, 102, 144412, Oct. 9, 2020. (Year: 2020).*

(Continued)

*Primary Examiner* — Vanessa T. Luk
(74) *Attorney, Agent, or Firm* — Sughrue Mion, PLLC

(57) ABSTRACT

Disclosed is a technology of permanently phase-transiting a semimetal using ion implantation. More particularly, the permanent phase transition of a dirac semimetal into a weyl semimetal can be induced by implanting non-magnetic material ions into the dirac semimetal according to an embodiment.

3 Claims, 21 Drawing Sheets

110

(51) Int. Cl.
*H10N 60/85* (2023.01)
*H10P 30/20* (2026.01)

(56) References Cited

OTHER PUBLICATIONS

A. Rancati, N. Pournaghavi, M.F. Islam, A. Debernardi, C.M. Canali, “Impurity-induced topological phase transitions in Cd3As2 and Na3Bi Dirac semimetals,” Physical Review B, 102, 195110, Nov. 9, 2020. (Year: 2020).*

Dongwoo Shin, Yongwoo Lee, M. Sasaki, Yoon Hee Jeong, Franziska Weickert, Jon B. Betts, Heon-Jung Kim, Ki-Seok Kim, Jeehoon Kim, “Violation of Ohm’s law in a Weyl metal,” Nature Materials, vol. 16, Nov. 2017, pp. 1096-1100. (Year: 2017).*

Ki Hoon Lee et al., “Phase Transitions of the Polariton Condensate in 2D Dirac Materials”, Physical Review Letters, 2018, pp. 157601-1 to 157601-6 , vol. 120.

* cited by examiner

【FIG. 1A】
110
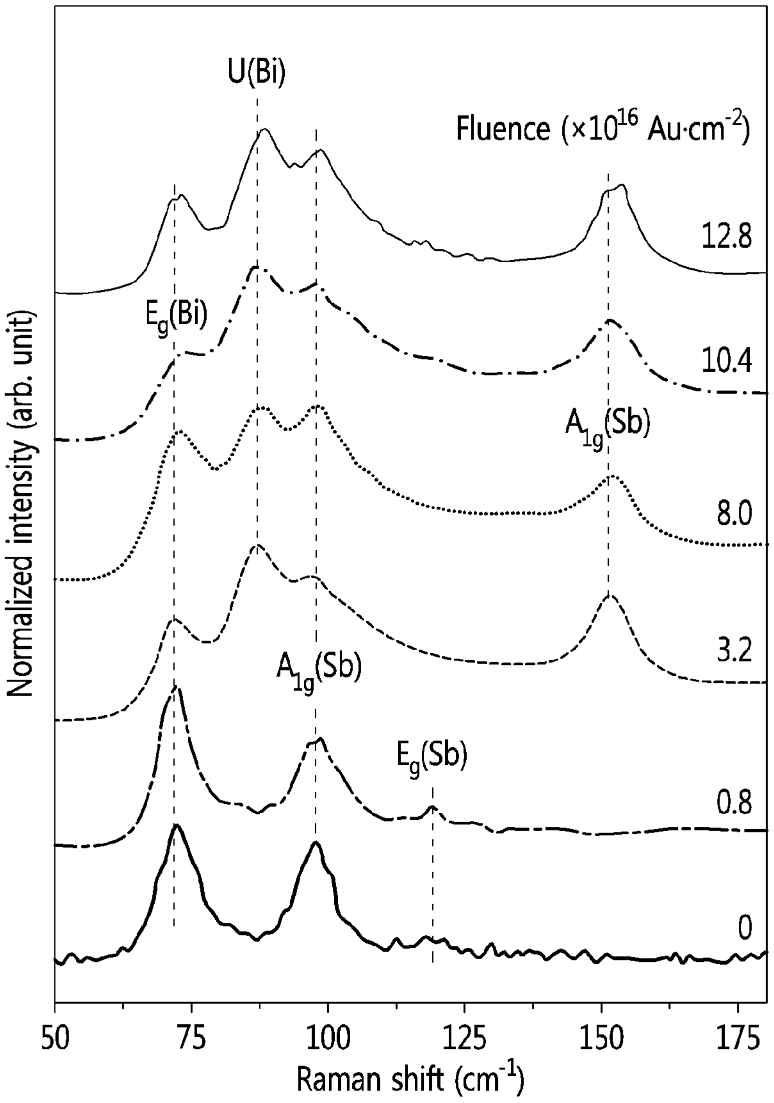

【FIG. 1B】
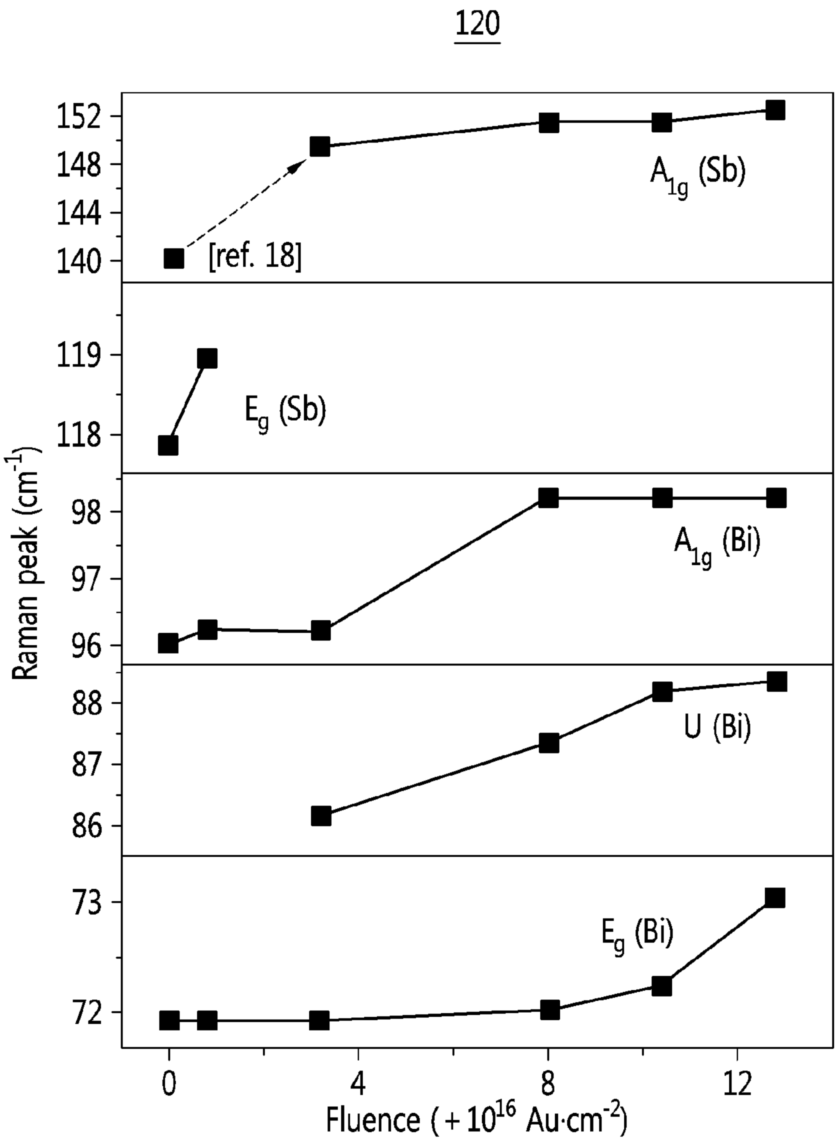

【FIG. 2A】
210
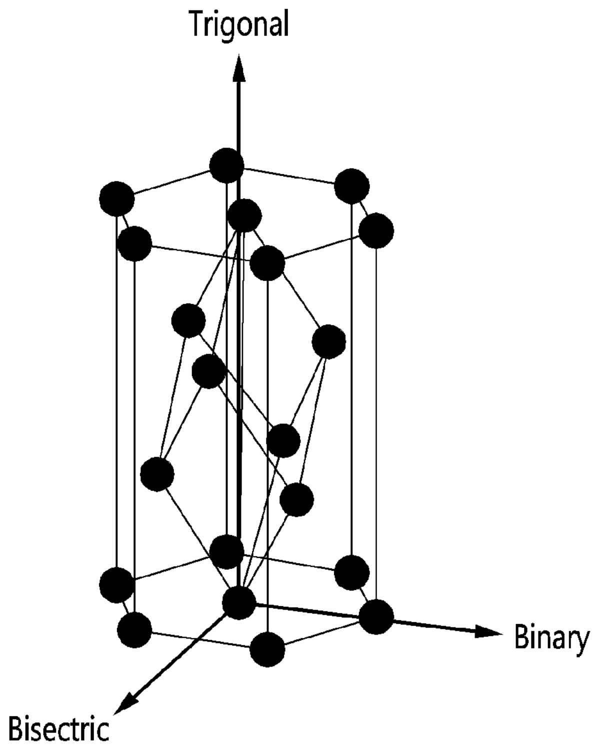

【FIG. 2B】
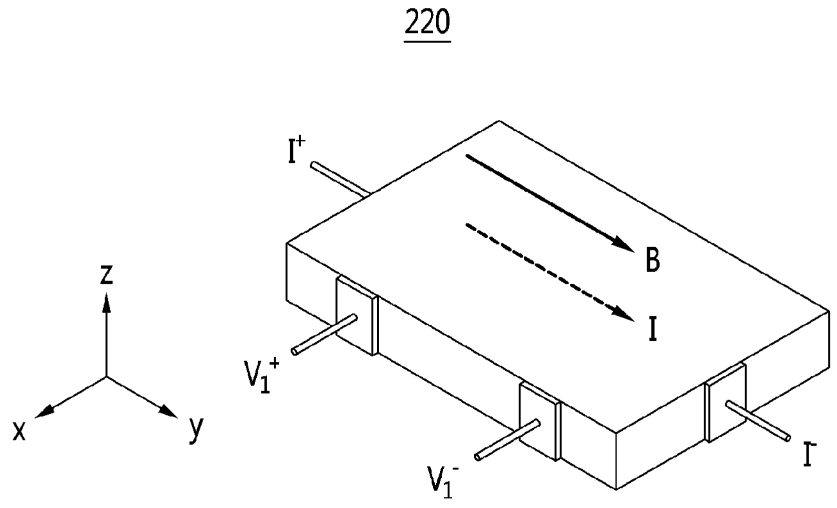
【FIG 2C】
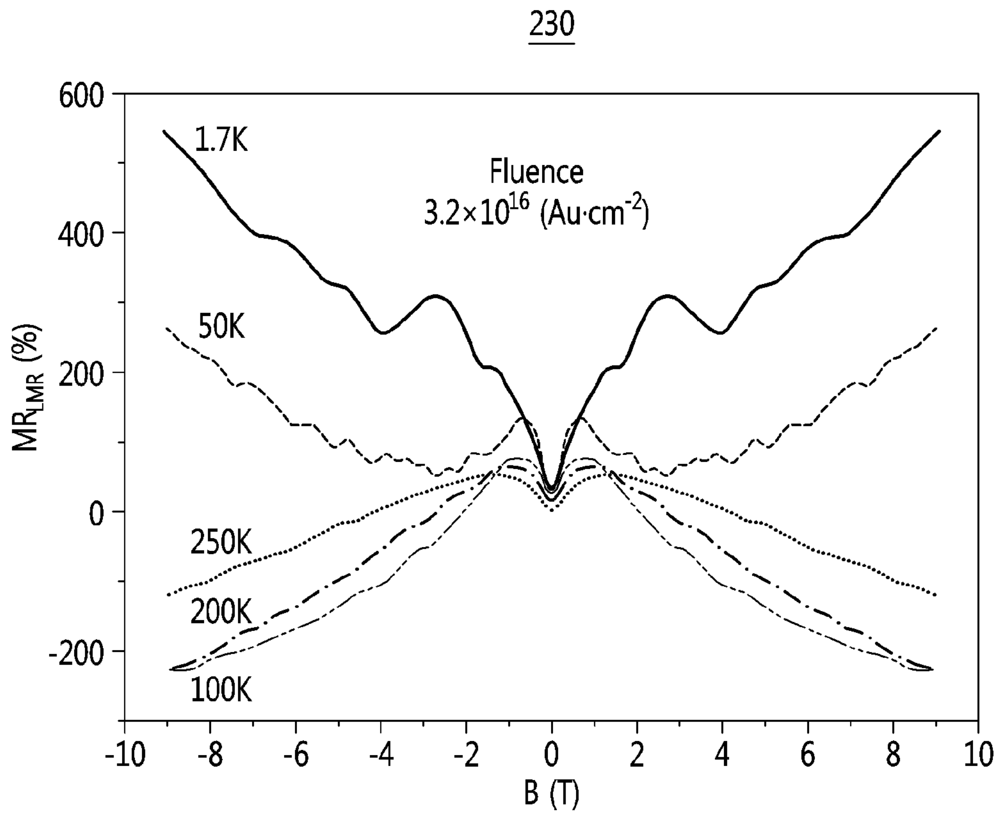

【FIG 2D】
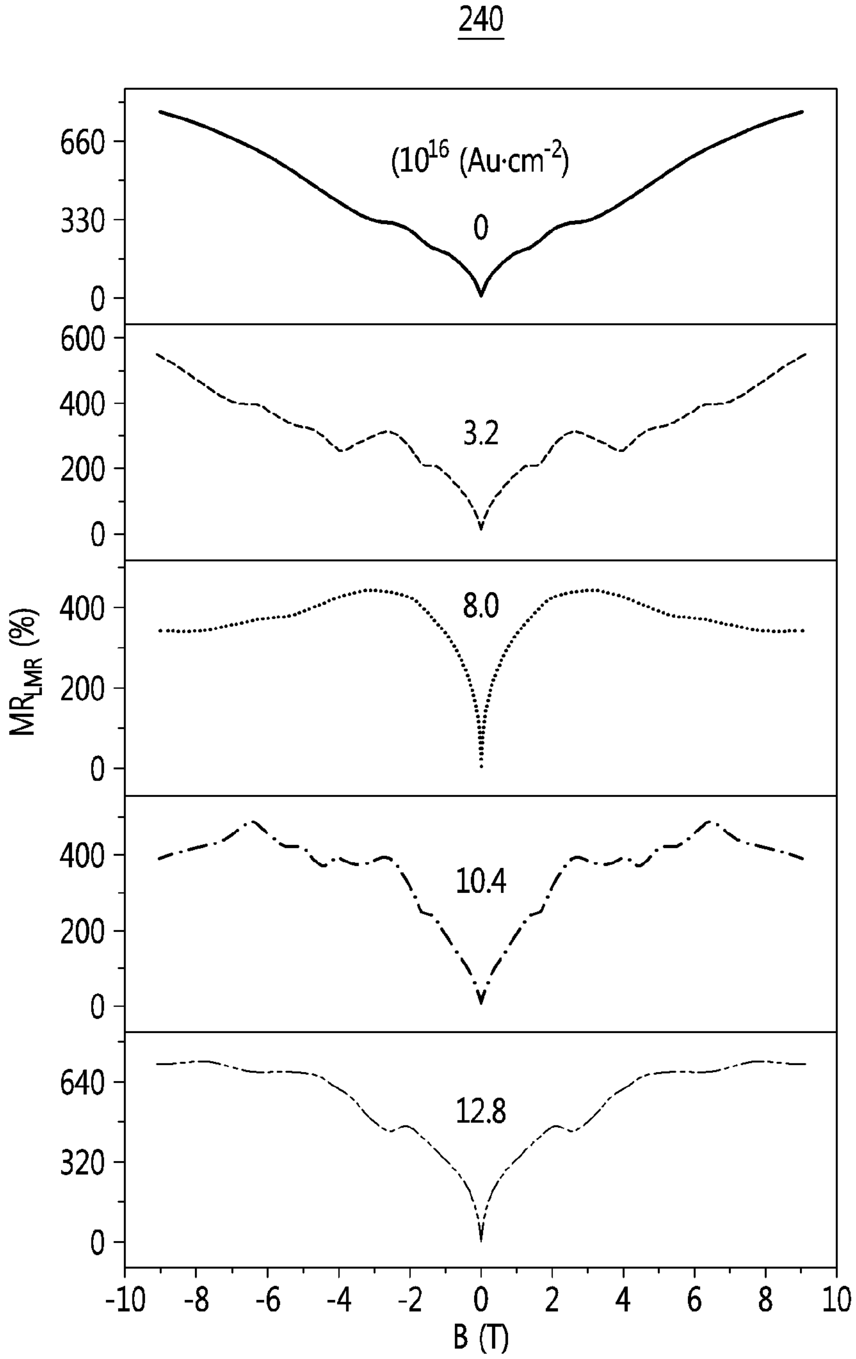

【FIG. 3A】
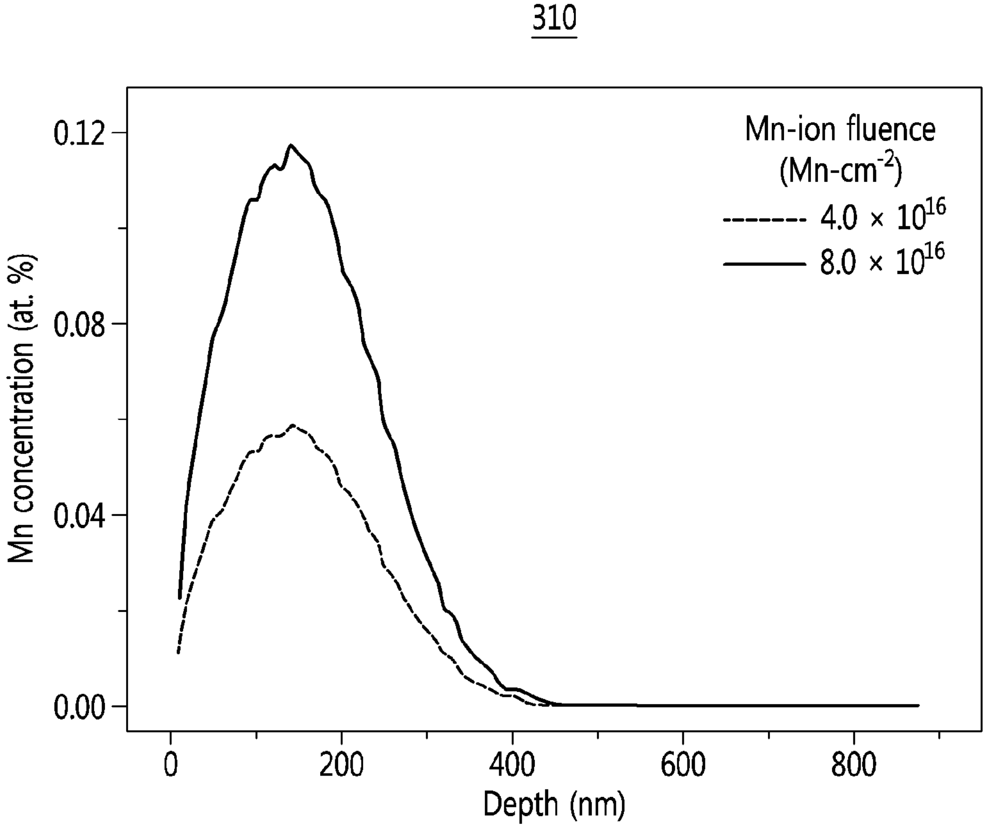

【FIG. 3B】
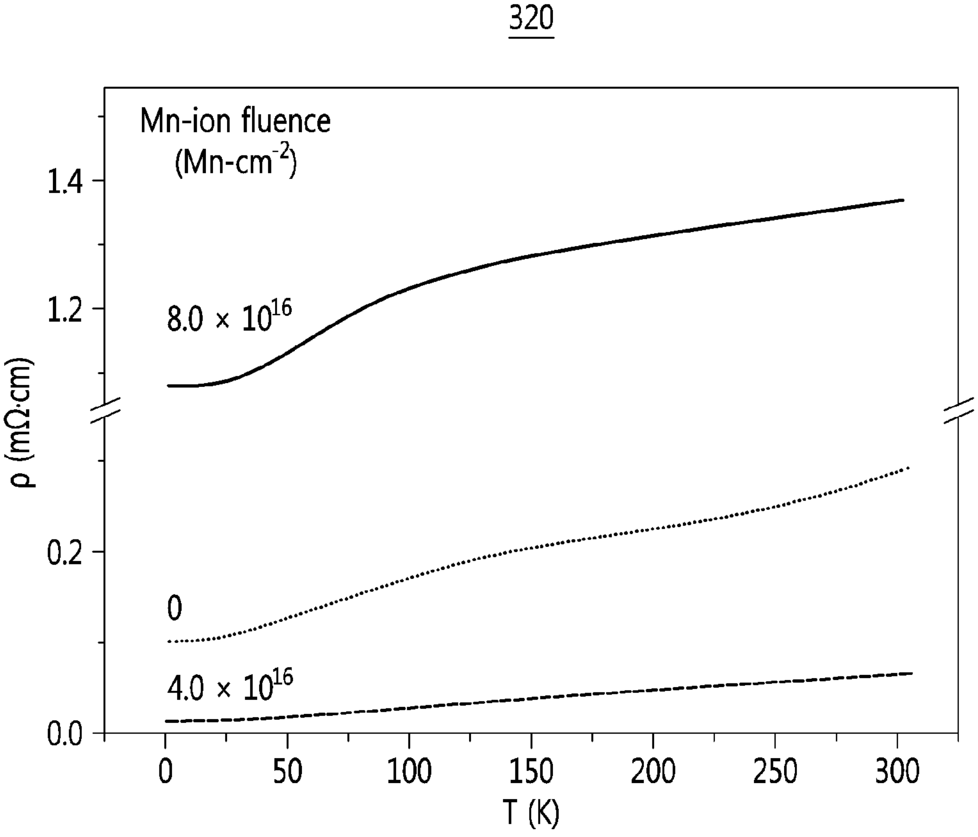

【FIG. 3C】
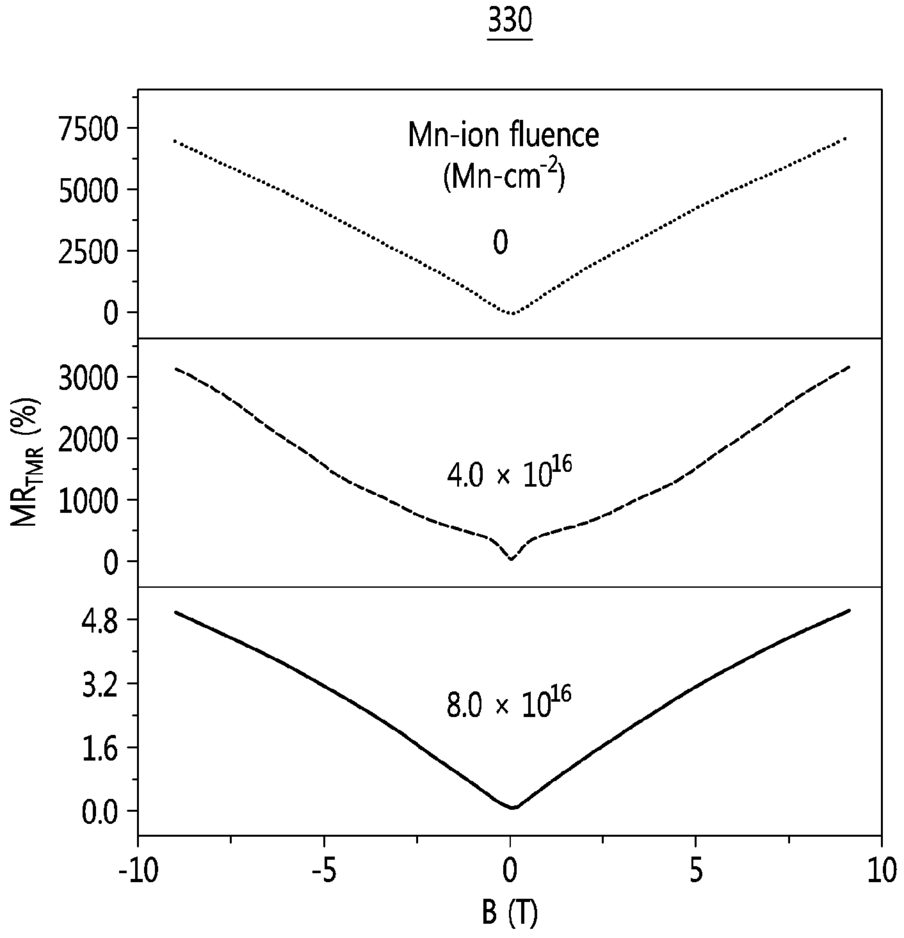

【FIG. 3D】
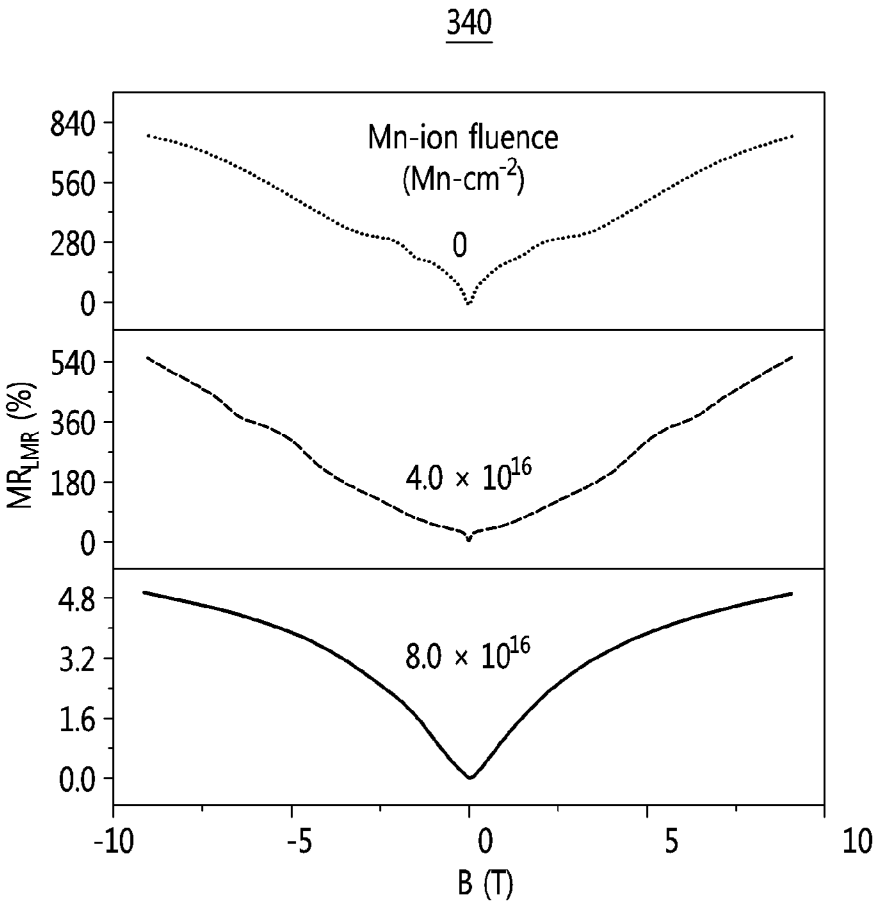

【FIG. 4A】
410
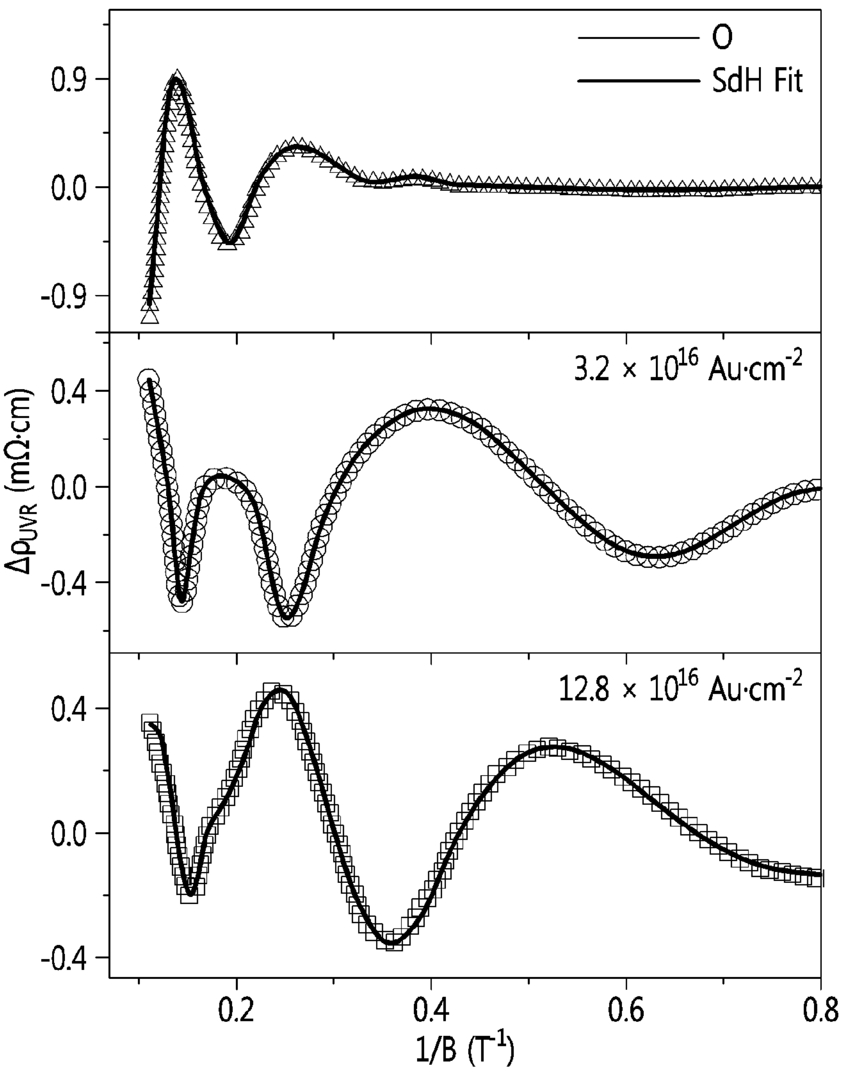

【FIG. 4B】
420
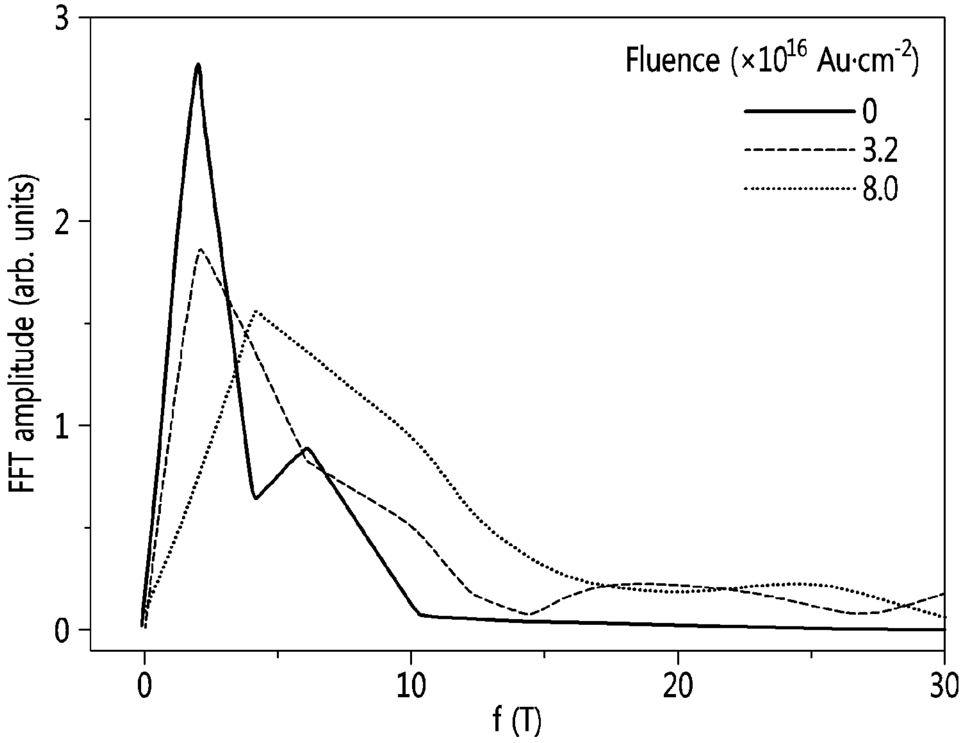

【FIG. 4C】
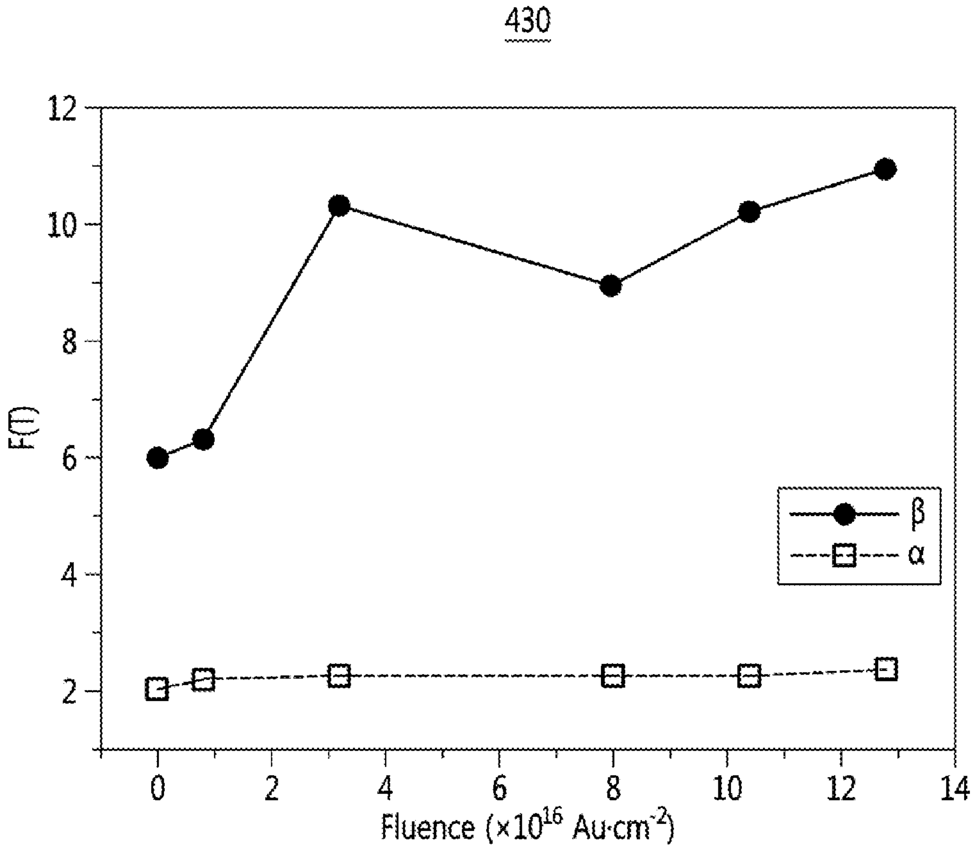

【FIG. 4D】
440
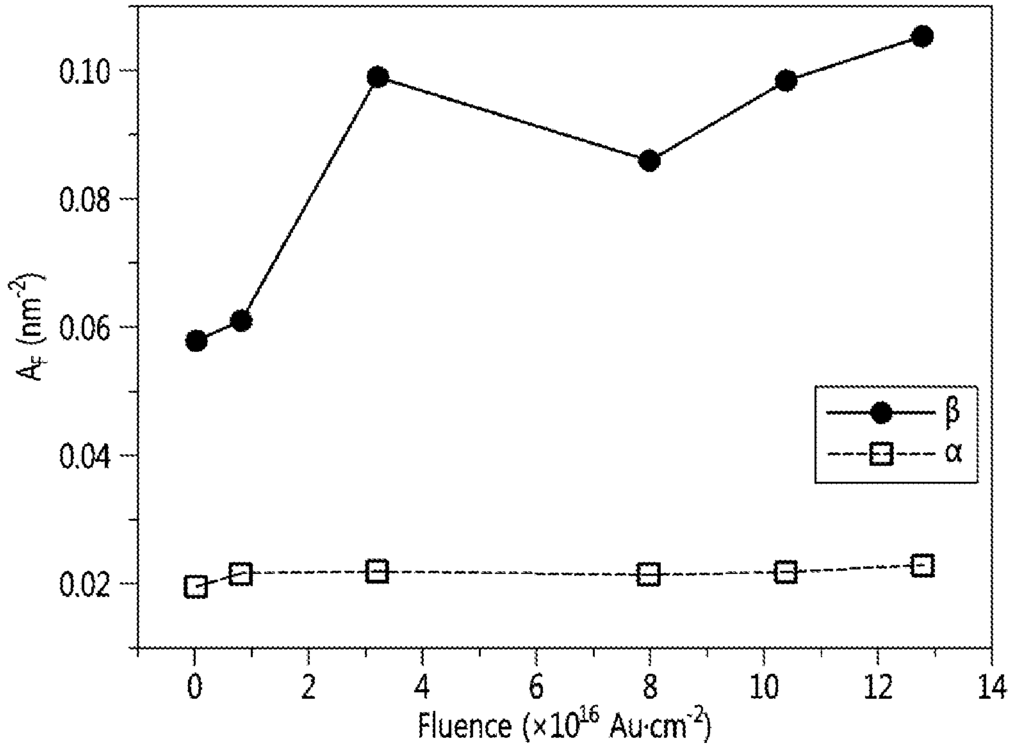

【FIG. 4E】
450
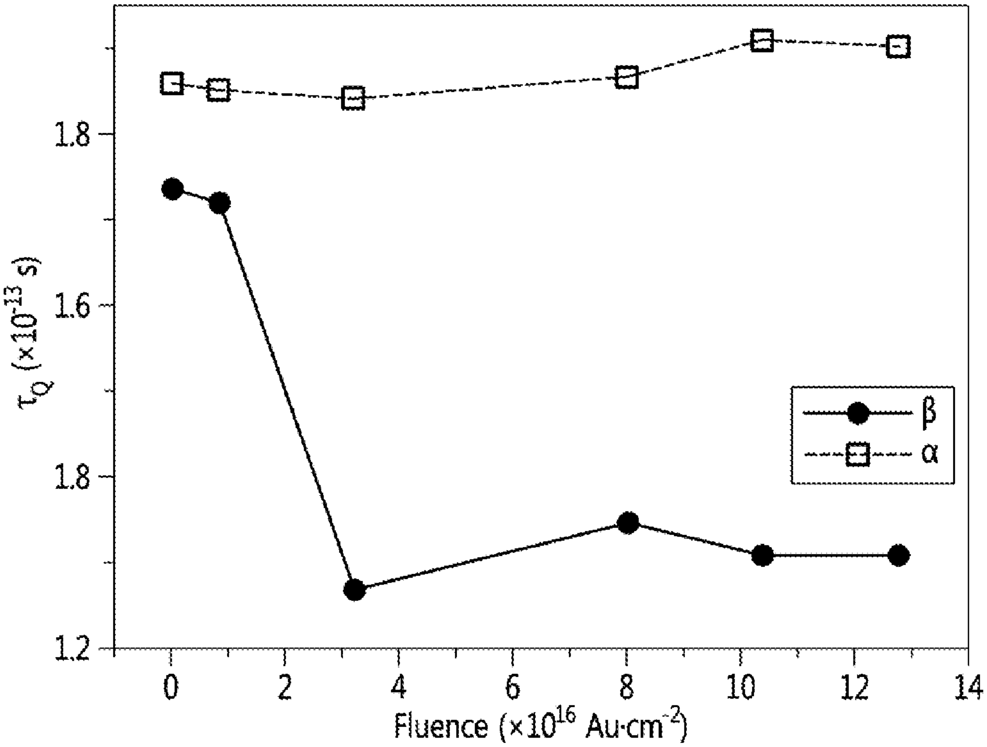

【FIG. 4F】
460
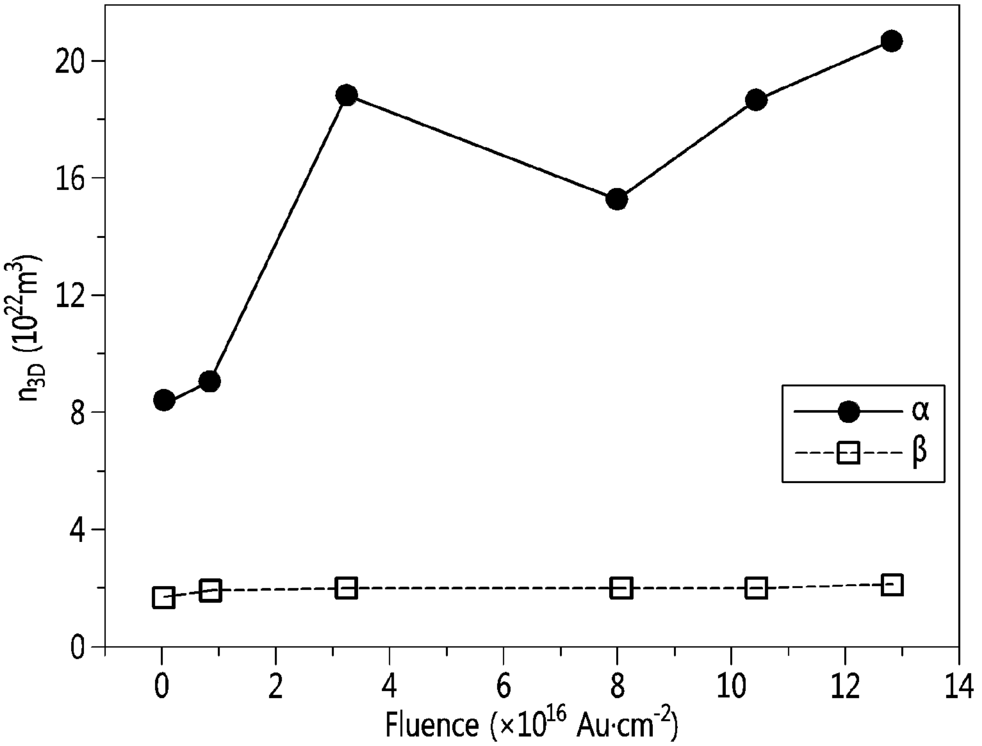

【FIG. 4G】
470
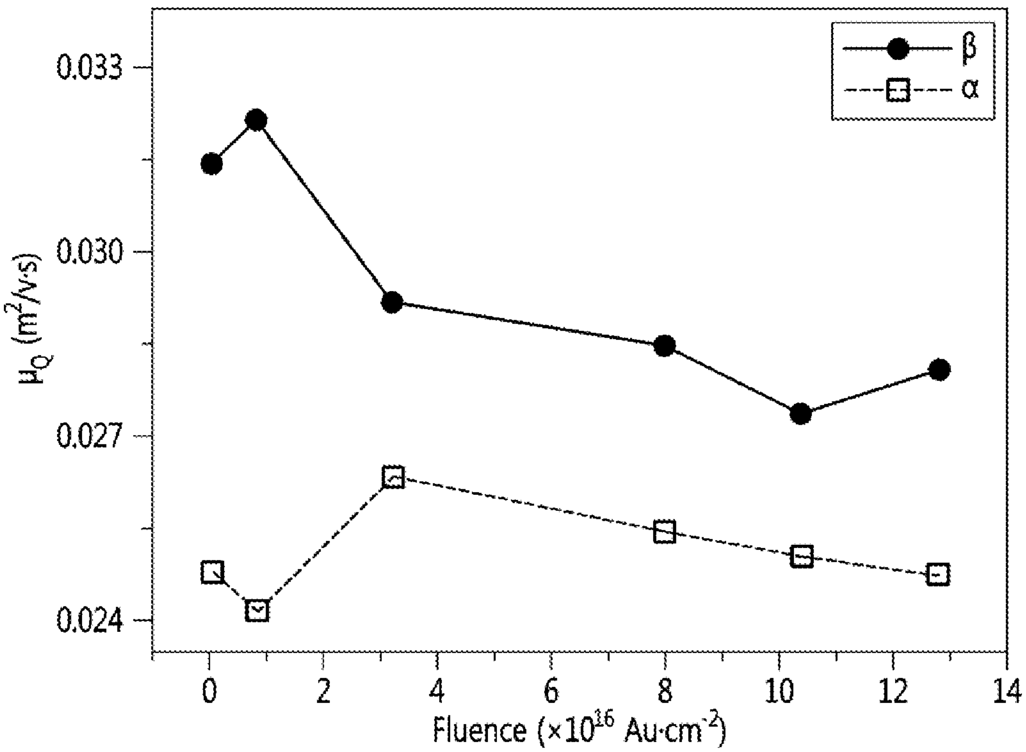

【FIG. 4H】
480
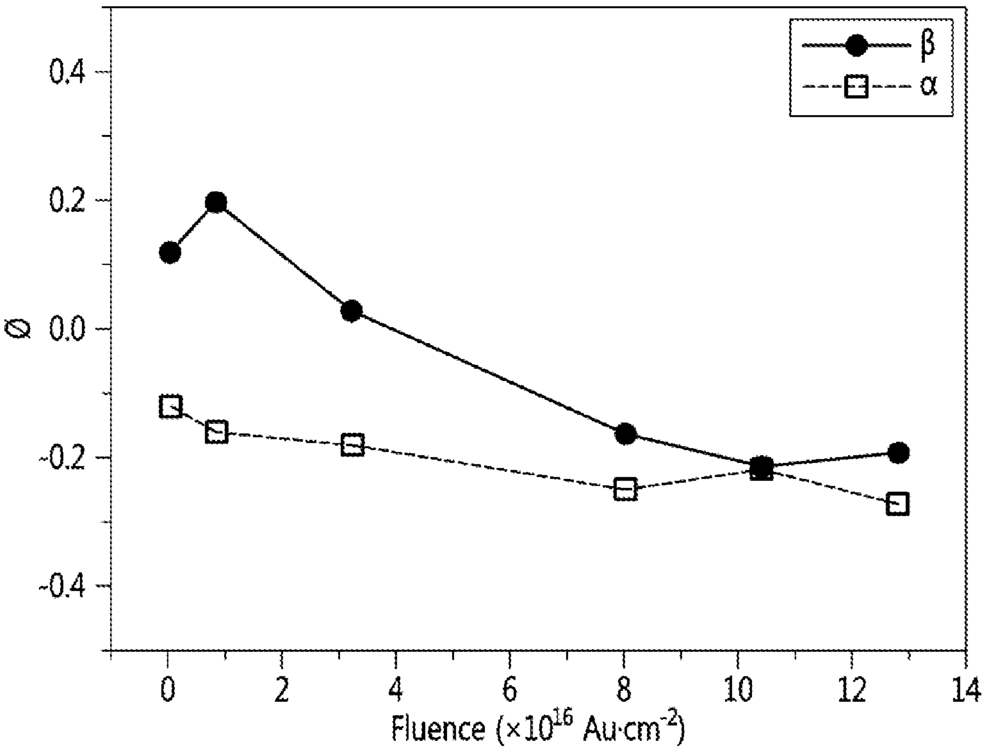

【FIG. 5A】
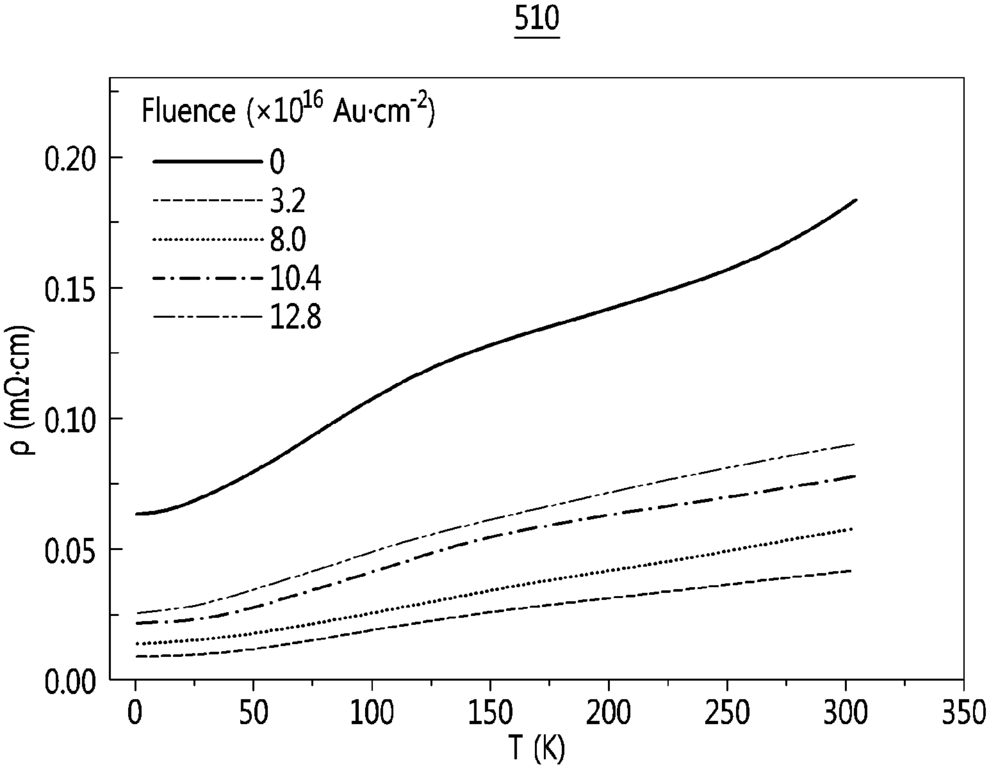

【FIG. 5B】
520
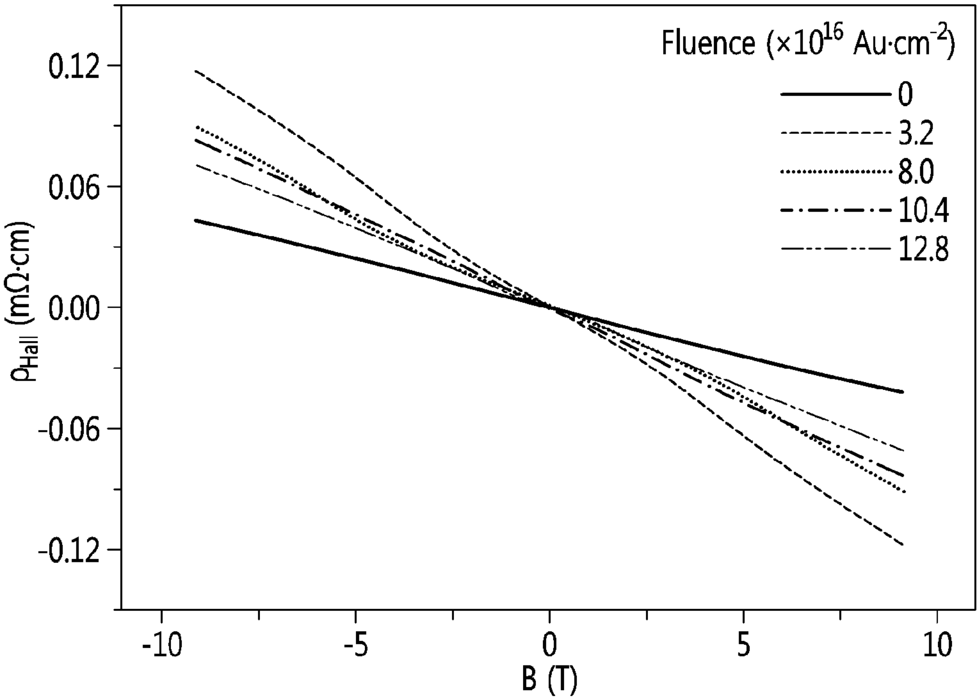

【FIG. 5C】
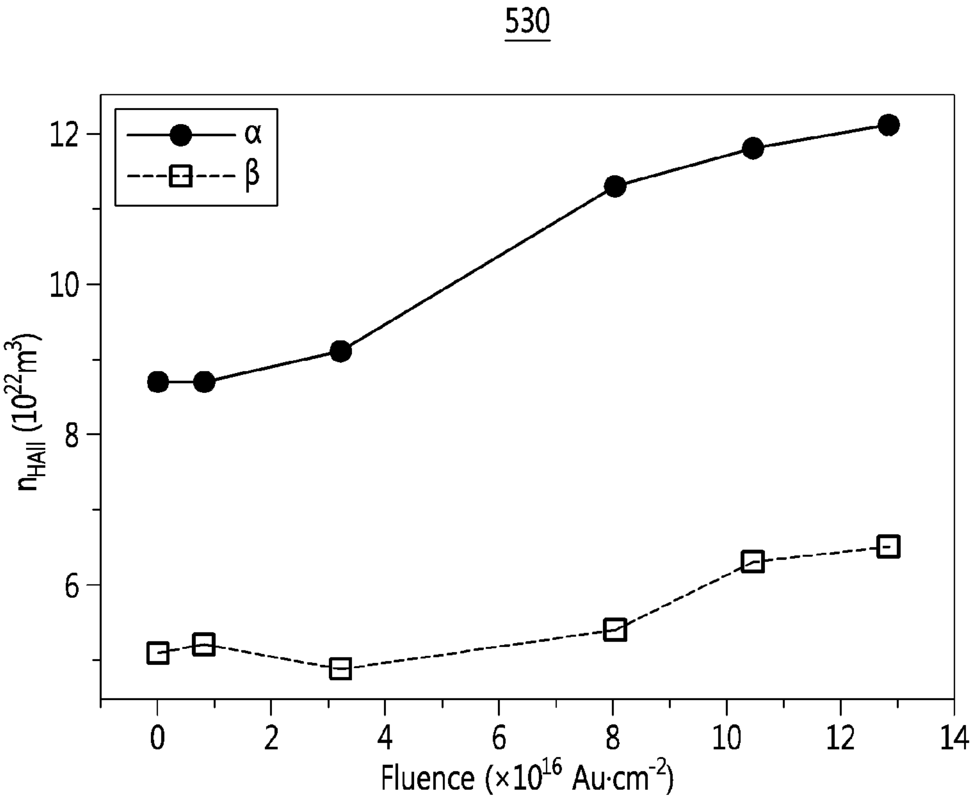

【FIG. 5D】
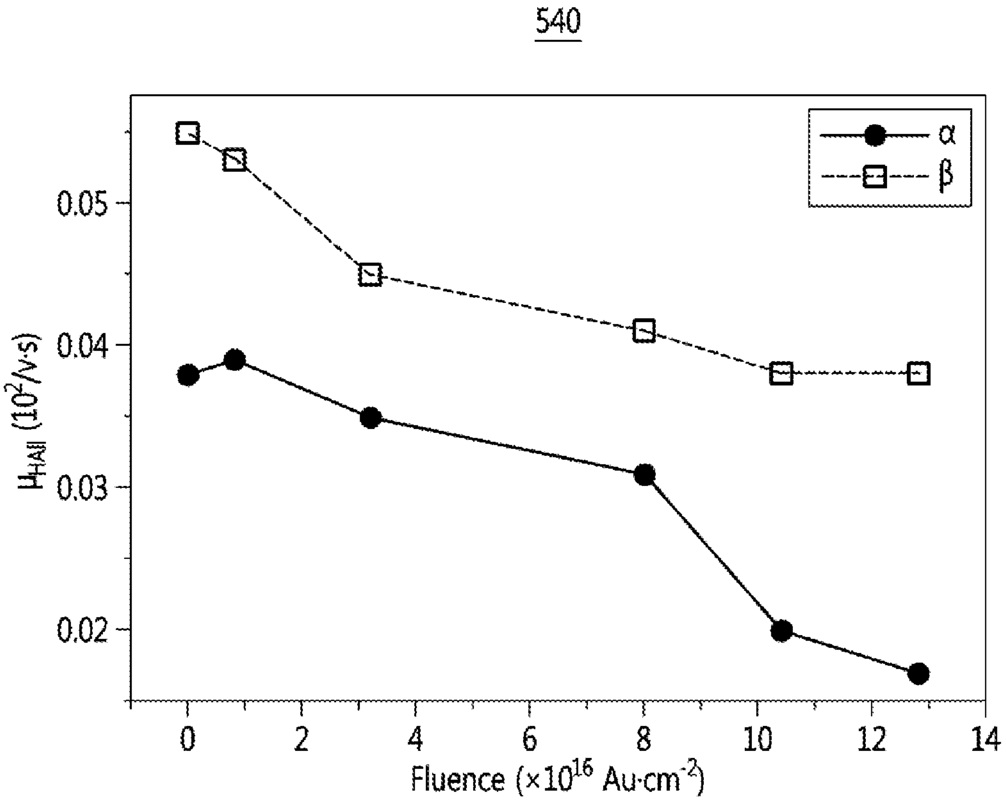
【FIG. 6】
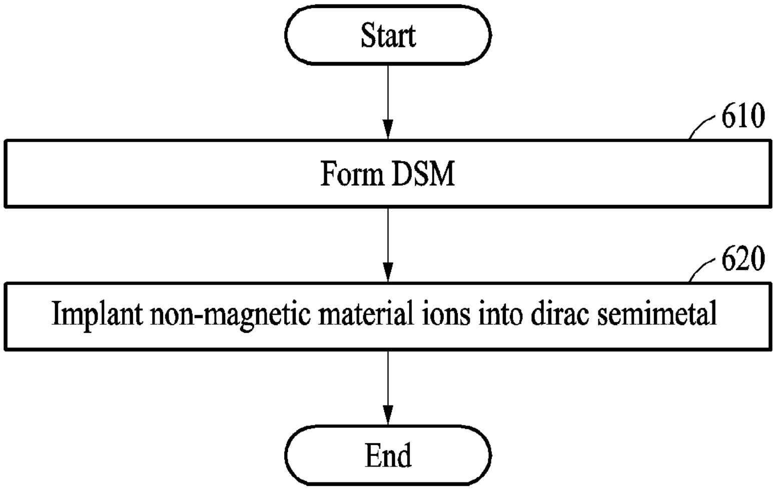

METHOD OF PERMANENTLY PHASE-TRANSITING SEMIMETAL USING ION IMPLANTATION AND SEMIMETAL PHASE-TRANSITED THEREBY

CROSS-REFERENCE TO RELATED APPLICATION

This application claims the priority benefit of Korean Patent Application No. 10-2021-0005347, filed on Jan. 14, 2021 in the Korean Intellectual Property Office, the disclosure of which is incorporated herein by reference.

BACKGROUND OF THE DISCLOSURE

Field of the Disclosure

The present disclosure relates to a technology of permanently phase-transiting a semimetal using ion implantation, and more particularly, to a technical idea of phase-transiting a dirac semimetal into a weyl semimetal.

Description of the Related Art

Currently, research into topological semimetals (TSM) such as dirac semimetals (DSMs), weyl semimetals (WSMs), nodal-line semimetals and triple-point semimetals is underway.

In particular, research into phase transition of DSMs into WSMs under a condition of low temperature or strong magnetic field is underway, but there is a limit in that all of the above researches relate to reversible (i.e., non-permanent) phase transition phenomena.

RELATED ART DOCUMENTS

Patent Documents

Korean Patent Application Publication No. 10-2020-0060676, "NOVEL THREE-DIMENSIONAL PHASE DIRAC SEMIMETAL KZnBi AND MANUFACTURING METHOD OF SAME"

Korean Patent Application Publication No. 10-2007-0055674, "ACCELERATED ION IMPLANTER USING LASER PLASMA BEAM AND PULSE SHOCK WAVE"

Non-Patent Document

Ki Hoon Lee, Changhee Lee, Hongki Min, and Suk Bum Chung Phys. Rev. Lett. 120, 157601—Published 9 Apr. 2018, "Phase Transitions of the Polariton Condensate in 2D Dirac Materials"

SUMMARY OF THE DISCLOSURE

Therefore, the present invention has been made in view of the above problems, and it is one object of the present invention to provide a method of inducing the permanent phase transition of a dirac semimetal (DSM) by implanting non-magnetic material ions into DSM; and DSM phase-transited by the method.

In accordance with an aspect of the present invention, the above and other objects can be accomplished by the provision of a dirac semimetal, the dirac semimetal being induced to be permanently phase-transited into a weyl semimetal (WSM) by implanting non-magnetic material ions thereinto.

According to an aspect, the non-magnetic material ions may be at least one ion type of gold (Au) ions, silver (Ag) ions, copper (Cu) ions, tin (Sn) ions, titanium (Ti) ions, zinc (Zn) ions, palladium (Pd) ions, platinum (Pt) ions, ruthenium (Ru) ions, iridium (Ir) ions and indium (In) ions.

According to an aspect, the non-magnetic material ions may be implanted in an implantation fluence of $3.2\times10^{16}$ $cm^{-2}$ to $12.8\times10^{16}$ $cm^{-2}$.

According to an aspect, a new Raman peak U (Bi), which did not previously exist, may be detected in a Raman shift range of $85.7\pm5$ $cm^{-1}$ of Raman spectrum, obtained by Raman spectroscopy method, of the dirac semimetal after implanting the non-magnetic material ions into the dirac semimetal.

In accordance with another aspect of the present invention, there is provided a method of permanently phase-transiting a dirac semimetal (DSM), the method including: forming DSM; and implanting non-magnetic material ions into the formed DSM to induce permanent phase transition thereof into a weyl semimetal (WSM).

According to an aspect, in the implanting, at least one non-magnetic material ion type of gold (Au) ions, silver (Ag) ions, copper (Cu) ions, tin (Sn) ions, titanium (Ti) ions, zinc (Zn) ions, palladium (Pd) ions, platinum (Pt) ions, ruthenium (Ru) ions, iridium (Ir) ions and indium (In) ions may be implanted into the formed DSM.

According to an aspect, in the implanting, the non-magnetic material ions may be implanted in an implantation fluence of $3.2\times10^{16}$ $cm^{-2}$ to $12.8\times10^{16}$ $cm^{-2}$ into the formed DSM.

According to an aspect, a new Raman peak U (Bi), which did not previously exist, may be detected in a Raman shift range of $85.7\pm5$ $cm^{-1}$ of Raman spectrum, obtained by Raman spectroscopy method, of the phase transition-induced DSM.

According to an aspect, in the forming, a bismuth-antimony-based DSM represented by Formula 1 below may be formed:

$$Bi_{1-x}Sb_x \quad \text{[Formula 1]}$$

where x is a positive real number satisfying $0<x<1$.

According to an aspect, in the forming, a mixture of bismuth element (Bi) and antimony element (Sb) may be annealed at 270° C. to 650° C. to form the DSM.

BRIEF DESCRIPTION OF THE DRAWINGS

The above and other objects, features and other advantages of the present disclosure will be more clearly understood from the following detailed description taken in conjunction with the accompanying drawings, in which:

FIG. 1A illustrates results of Raman spectroscopy analysis on a dirac semimetal (DSM) according to an embodiment;

FIG. 1B illustrates ion implantation-dependent shift results of the Raman peaks derived by the Raman spectroscopy method of FIG. 1A;

FIGS. 2A to 2D are diagrams for explaining the longitudinal magnetoresistance (LMR) characteristics of DSM according to an embodiment;

FIGS. 3A to 3D are diagrams for explaining MR characteristics of DSM into which magnetic material ions are implanted;

FIGS. 4A to 4H are diagrams for explaining the quantum oscillation characteristics of DSM according to an embodiment;

FIGS. 5A to 5D are diagrams for explaining the electrical characteristics and Hall-effect characteristics of DSM according to an embodiment; and FIG. 6 illustrates a method of permanently phase-transiting DSM according to an embodiment.

DETAILED DESCRIPTION OF THE DISCLOSURE

Specific structural and functional descriptions of embodiments according to the concept of the present disclosure disclosed herein are merely illustrative for the purpose of explaining the embodiments according to the concept of the present disclosure. Furthermore, the embodiments according to the concept of the present disclosure can be implemented in various forms and the present disclosure is not limited to the embodiments described herein.

The embodiments according to the concept of the present disclosure may be implemented in various forms as various modifications may be made. The embodiments will be described in detail herein with reference to the drawings. However, it should be understood that the present disclosure is not limited to the embodiments according to the concept of the present disclosure, but includes changes, equivalents, or alternatives falling within the spirit and scope of the present disclosure.

The terms such as "first" and "second" are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the scope of rights according to the concept of the present invention.

It will be understood that when an element is referred to as being "on", "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Other words used to describe the relationship between elements should be interpreted in a like fashion (e.g., "between," versus "directly between," "adjacent," versus "directly adjacent," etc.).

The terms used in the present specification are used to explain a specific exemplary embodiment and not to limit the present inventive concept. Thus, the expression of singularity in the present specification includes the expression of plurality unless clearly specified otherwise in context. Also, terms such as "include" or "comprise" in the specification should be construed as denoting that a certain characteristic, number, step, operation, constituent element, component or a combination thereof exists and not as excluding the existence of or a possibility of an addition of one or more other characteristics, numbers, steps, operations, constituent elements, components or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present disclosure will now be described more fully with reference to the accompanying drawings, in which exemplary embodiments of the invention are shown. This disclosure may, however, be embodied in many different forms and should not be construed as limited to the exemplary embodiments set forth herein. Like reference numerals in the drawings denote like elements.

FIG. 1A illustrates results of Raman spectroscopy analysis on a dirac semimetal (DSM) according to an embodiment, and FIG. 1B illustrates ion implantation-dependent shift results of the Raman peaks derived by the Raman spectroscopy method of FIG. 1A.

Referring to FIGS. 1A to 1B, reference numeral 110 illustrates Raman spectra of DSM dependent upon a change in an ion implantation fluence ($\phi_G$), and reference numeral 120 illustrates Raman peak shift results of DSM dependent upon a change in an ion implantation fluence ($\phi_G$).

For example, DSM may be a bismuth-antimony-based DSM represented by Formula 1 below.

$$Bi_{1-x}Sb_x \quad \text{[Formula 1]}$$

where x may be a positive real number satisfying 0<x<1. Hereinafter, $Bi_{0.96}Sb_{0.04}$ is exemplified as DSM, but the DSM according to an embodiment is not limited thereto and may be any known DSM materials.

In addition, in reference numerals 110 and 120, Raman peaks Eg (Bi)/$A_{1g}$ (Bi) and $E_g$(Sb)/$A_{1g}$ (Sb) respectively represent Bi—Bi and Sb—Sb oscillation modes, $A_{1g}$ mode may be singly degenerated, and $E_g$ mode may be doubly degenerated.

Specifically, the DSM according to an embodiment may be induced to be permanently phase-transited into a weyl semimetal (WSM) by implanting ions of a non-magnetic material thereinto.

For example, the non-magnetic material ions may be implanted in an implantation fluence ($\phi_G$) of $3.2\times10^{16}$ $cm^{-2}$ to $12.8\times10^{16}$ $cm^{-2}$ into the DSM according to an embodiment.

In addition, the non-magnetic material ions may be at least one ion type of gold (Au) ions, silver (Ag) ions, copper (Cu) ions, tin (Sn) ions, titanium (Ti) ions, zinc (Zn) ions, palladium (Pd) ions, platinum (Pt) ions, ruthenium (Ru) ions, iridium (Ir) ions and indium (In) ions.

Preferably, gold (Au) ions of the non-magnetic material ions types may be implanted in an amount of $3.2\times10^{16}$ $cm^{-2}$ or more into the DSM according to an embodiment.

Meanwhile, in a Raman shift range of 85.7±5 $cm^{-1}$ of Raman spectrum, obtained by a Raman spectroscopy method, of the DSM according to an embodiment after implanting non-magnetic material ions thereinto, a new Raman peak U (Bi), which did not previously exist, may be detected.

For example, Raman peak U (Bi) is a result of inversion-symmetry breaking induced by implanting $3.2\times10^{16}$ $cm^{-2}$ or more of non-magnetic material ions and may mean a new mode detected from the DSM according to an embodiment.

From reference numeral 110, it can be confirmed that the DSM according to an embodiment shows $\phi_G$-dependent Raman spectra.

For example, Raman peaks $E_g$ (Bi) and $A_{1g}$ (Bi) of general DSM corresponding to $\phi_G$=0 may be respectively detected in a range of 72 $cm^{-1}$ to 75 $cm^{-1}$ and a range of 97 $cm^{-1}$ to 100 $cm^{-1}$ of a Raman shift corresponding to Bi—Bi oscillation. The peaks may be typical peaks with rhombohedral $R\bar{3}m$ symmetry.

In addition, other Raman peaks $E_g$ (Bi) and $A_{1g}$ (Bi) of DSM corresponding to $\phi_G=0$ may be respectively detected in a range of 118 $cm^{-1}$ to 120 $cm^{-1}$ and a range of 138 $cm^{-1}$ to 141 $cm^{-1}$ of Raman shift corresponding to Sb—Sb oscillation.

Similarly, it can be confirmed that there is no significant change in DSM corresponding to $\phi_G=0.8\times10^{16}$ $cm^2$, compared to the case of $\phi_G=0$. However, it can be confirmed that an abrupt change is observed in the DSM according to an embodiment corresponding to $\phi_G\geq3.2\times10^{16}$ $cm^{-2}$.

Specifically, in the DSM according to an embodiment, a new Raman peak U (Bi) can be observed at 85.7 $cm^{-1}$ between Raman peaks $E_g$ (Bi) and $A_{1g}$ (Bi).

In addition, in the DSM according to an embodiment, Raman peaks $A_{1g}$ (Sb), which cannot be observed in a conventional $Bi_{0.96}Sb_{0.04}$ crystal, are observed at 149.7 $cm^{-1}$, and the Raman peaks $A_{1g}$ (Sb) may be blue-shifted, by $\phi_G=3.2\times10^{16}$ Au $cm^{-2}$ implantation, at a frequency location higher than previously known 138 $cm^{-1}$ to 141 $cm^{-1}$.

Meanwhile, in the case of the DSM according to an embodiment, it can be confirmed that the overall shape of Raman spectrum hardly changes even when an implantation fluence of non-magnetic material ions is increased (8.0, 10.4, 12.8).

From reference numeral 120, it can be confirmed that four Raman peaks $E_g$ (Bi), U (Bi), $A_{1g}$ (Bi) and $A_{1g}$ (Sb) of DSM are gradually blue-shifted with increasing from $\phi_G=0$ to $\phi_G=12.8\times10^{16}$ $cm^{-2}$.

Specifically, it is known that all Raman peaks of $MoTe_2$ as one of weyl semimetals (WSMs) originate from two types of oscillations the occur along a zigzag Mo atomic chain (z-mode) and a mirror plane (m-mode) perpendicular to the zigzag chain, and some Raman in-active modes of a centrosymmetric monoclinic phase may appear cooling-driven transition into an orthorhombic phase as a result of inversion-symmetry breaking.

On the other hand, Raman doublet observed in a composition having more W than that in a monoclinic $Mo_{1-x}W_xTe_2$ alloy may be caused by inversion-symmetry breaking that occurs by randomly substituting Mo atom with W atom. Such a result suggests that whether the inversion symmetry in the crystal structure is broken can be confirmed by analyzing the Raman scattering behavior.

Meanwhile, inversion-symmetry breaking can be verified by first-principle calculation and Raman scattering of a $CdTiO_3$ ilmenite phase belonging to the rhombohedral $R\bar{3}m$ group. Specifically, Raman peaks Eg and Ag in the ilmenite rhombohedral $R\bar{3}m$ group; and additionally detected Raman peaks were observed in both low-temperature and high-pressure spectra, and it was confirmed that the Raman frequency was blue-shifted under high pressure.

The above-described verification results for the ilmenite rhombohedral are very similar to the $\phi_G$-dependent Raman spectra of the DSM $Bi_{0.96}Sb_{0.04}$ crystal according to an embodiment shown in reference numerals 110 and 120. This means that the same conclusion is applicable to the $Bi_{0.96}Sb_{0.04}$ crystal having the same rhombohedral $R\bar{3}m$ symmetry as the ilmenite rhombohedral.

In other words, inversion-symmetry breaking of the DSM according to an embodiment was induced due to implantation of $\phi_G\geq3.2\times10^{16}$ $cm^{-2}$ of non-magnetic material ions and, as a result, it was confirmed that the DSM $Bi_{0.96}Sb_{0.04}$ crystal was converted to WSM due to the inversion-symmetry breaking.

FIGS. 2A to 2D are diagrams for explaining the longitudinal magnetoresistance (LMR) characteristics of DSM according to an embodiment.

Referring to FIGS. 2A to 2D, reference numeral 210 illustrates a crystal structure of the DSM according to an embodiment ($Bi_{1-x}Sb_x$), and reference numeral 220 illustrates an example of confirming LMR characteristics by applying a magnetic field (B) in a direction parallel to a current (I) direction in a state in which voltage ($V_1$) is applied to the DSM according to an embodiment.

In addition, reference numeral 230 illustrates temperature (T) change-dependent LMR characteristics of the DSM according to an embodiment into which non-magnetic material ions were implanted in an amount of $\phi_G=3.2\times10^{16}$ $cm^{-2}$, and reference numeral 240 illustrates ion implantation fluence ($\phi_G$) change-dependent LMR characteristics of a non-magnetic material of the DSM according to an embodiment at a temperature of 1.7 K.

As shown in reference numeral 210, the DSM according to an embodiment is a bismuth-antimony-based DSM ($Bi_{1-x}Sb_x$) and has a rhombohedral crystal structure. Here, two atoms in each unit cell may have $R\bar{3}m$ symmetry.

Specifically, the fermion of the DSM according to an embodiment may be a three-dimensional structure corresponding to a two-dimensional dirac of graphene. In addition, unlike the dirac cone of graphene, DSM can have linear energy-momentum dispersions along all three directions (binary, bisectric and trigonal).

In addition, DSM crystal may require time reversal symmetry and inversion symmetry to prevent a dirac node from being split into two bile nodes.

Meanwhile, during transition from a topological insulator to a normal insulator, touching points of a conduction band and a valence band at a critical point may become 3D dirac points or weyl points depending on the presence or absence of inversion symmetry.

In addition, Berry curvature, as a value characterizing topological entanglement between a conduction band and a valence band, can be a singularity at Weyl points that act as a unipolar in a momentum space with fixed chirality.

As shown in reference numeral 230, in the topological semimetal LMR, a magnetic field (B) changes from '0' to a small magnitude, and then decrease in an intermediate magnetic field range. In addition, when a magnetic field is additionally increased, a sharp increase is observed. Such a phenomenon is called negative LMR (NMR).

Specifically, the NMR of the DSM according to an embodiment is observed at a temperature of 1.7 K (T), and it can be confirmed that the NMR is further strengthened as the temperature (T) increases up to 100 K, but decreases when the temperature is higher than 100 K.

From reference numeral 240, it can be confirmed that positive LMR is observed in a general DSM crystal into which non-magnetic material ions were not implanted, but NMR is not observed therein.

On the other hand, in the DSM according to an embodiment, the behavior of LMR begins to be observed at $\phi_G=3.2\times10^{16}$ $cm^{-2}$, the behavior of LMR is more clearly observed at $\phi_G=8.0\times10^{16}$ $cm^{-2}$, and LMR decreased at $\phi_G>8.0\times10^{16}$ $cm^{-2}$.

That is, in the DSM according to an embodiment, it can be confirmed that a chiral anomaly exists in weyl fermions as LMR is observed. In other words, it can be confirmed that the DSM according to an embodiment is phase-transited into WSM.

FIGS. 3A to 3D are diagrams for explaining MR characteristics of DSM into which magnetic material ions are implanted.

Referring to FIGS. 3A to 3D, reference numeral 310 illustrates Mn peak concentrations calculated by stopping and range of ions in matter (SRIM) simulation for DSM $Bi_{0.96}Sb_{0.04}$ crystal into which manganese (Mn) ions, as magnetic material ions, are implanted, and reference numeral 320 illustrates Mn ion fluence and temperature (T) change-dependent electrical resistance (ρ) characteristics of DSM.

In addition, reference numeral 330 illustrates Mn ion fluence-dependent TMR characteristics ($MR_{TMR}$) of DSM, and reference numeral 340 illustrates Mn ion fluence-dependent LMR characteristics ($MR_{LMR}$) of DSM.

Referring to reference numeral 310, Mn ions were implanted in implantation fluences of $4.0\times10^{16}$ $cm^{-2}$ and $8.0\times10^{16}$ $cm^{-2}$ into DSM $Bi_{0.96}Sb_{0.04}$ crystal prepared by cutting a bulk crystal along a plane (001) thereof in a room temperature environment, and then the electrical resistance (ρ) characteristics, TMR characteristics and LMR characteristics of the Mn ion-implanted DSM $Bi_{0.96}Sb_{0.04}$ crystal were confirmed.

Referring to reference numerals 320 to 340, it can be confirmed that, in the DSM $Bi_{0.96}Sb_{0.04}$ crystal into which Mn ions, as magnetic material ions, were implanted, positive MR is only observed regardless of a relative direction (i.e., TMR, LMR) of a magnetic field (B) verse an electric field (E), and an ion implantation fluence.

That is, it can be confirmed that, unlike the DSM according to an embodiment into which non-magnetic material ions were implanted, LMR was not observed in DSM into which magnetic material ions were implanted, which indicates that chiral anomaly does not exist.

In other words, it can be confirmed that DSM into which magnetic material ions were implanted was not phase transited, unlike the case that non-magnetic material ions were implanted.

FIGS. 4A to 4H are diagrams for explaining the quantum oscillation characteristics of DSM according to an embodiment.

Referring to FIGS. 4A to 4H, reference numeral 410 illustrates the resistance characteristics ($\Delta\rho_{UVR}$) of the DSM according to an embodiment dependent upon a change in an ion implantation fluence ($\phi_G$) of a non-magnetic material and a change in a reciprocal value (1/B) of a magnetic field of the non-magnetic material, and reference numeral 420 illustrates fast fourier transform (FFT) results of the DSM according to an embodiment dependent upon the implantation fluence ($\phi_G$) of nonmagnetic ions.

Specifically, reference numerals 410 to 420 illustrate shubnikov-de haas (SdH) oscillation measurement results of data extracted from the LMR data of FIG. 2D.

In addition, reference numerals 430 to 480 illustrate the characteristics of quantum oscillation parameters corresponding to the measured SdH oscillation.

Specifically, reference numerals 430 to 450 respectively illustrate frequency (F), cross-sectional area ($A_F$) and quantum scattering time ($\tau_Q$) measurement results which correspond to the implantation fluences ($\phi_G$) of nonmagnetic ions in an α Fermi pocket and β Fermi pocket through SdH oscillation.

In addition, reference numerals 460 to 480 respectively illustrate carrier density ($n_{3D}$), quantum mobility ($\mu_Q$) and phase shift (ϕ) measurement results which correspond to the implantation fluences ($\phi_G$) of nonmagnetic ions in a Fermi pocket and β Fermi pocket through SdH oscillation.

Specifically, reference numeral 420 illustrates typical FFT spectra of sdH oscillation of the DSM according to an embodiment at ion implantation fluences of $\phi_G$=(0, 3.2, 12.8)$\times10^{16}$ $cm^{-2}$. In each $\phi_G$, SdH oscillation can exhibit strong frequency ($f_\alpha$) and weak frequency ($f_\beta$).

Reference numeral 430 illustrates $f_\alpha$ and $f_\beta$ corresponding to each $\phi_G$. Here, $f_\alpha$ exhibits negligible small fluctuations regardless of $\phi_G$, whereas $f_\beta$ rapidly increases at $\phi_G=3.2\times10^{16}$ $cm^{-2}$ and exhibits a negligible small change with subsequent increasing $\phi_G$.

Meanwhile, the SdH quantum oscillation can be generally explained by the lifshitz-kosevich (LK) equation, and parameters corresponding to an α Fermi pocket and a β Fermi pocket may be obtained by fitting FFT amplitude data based on the LK equation.

The SdH oscillation according to the resistance of a metal is generated in the Landau quantization of an electronic state in a magnetic field (B) and may be expressed as $$A_F\frac{\hbar}{eB}=2\pi\left(n+\frac{1}{2}-\frac{\phi_B}{2\pi}\right)=2\pi(n+\phi)$$

according to the Lifshitz-Onsager quantization rule. Here, ℏ denotes a reduced planck's constant, e denotes an elementary charge, and $\phi_B$ denotes a berry phase. The berry phase $\phi_B$ may be provided from phase shift ϕ according to the Landau fan diagram.

As shown in reference numerals 440 to 470, it can be confirmed that almost all parameters, except for phase shift (ϕ) such as Dingle temperature ($T_D$), quantum scattering time ($\tau_Q$), carrier density ($n_{3D}$), quantum mobility ($\mu_Q$), the cross-sectional area of Fermi pocket ($A_F$), cyclotron mass (m*), Fermi velocity ($v_F$), Fermi wave vector ($k_F$), mean free path ($I_Q$) and Fermi level ($E_F$), in the α Fermi pocket do not show dependence on $\phi_G$.

On the other hand, it can be confirmed that almost all parameters, except for phase shift (ϕ), which correspond to β Fermi pocket, exhibit rapid changes at $\phi_G=3.2\times10^{16}$ $cm^{-2}$ and negligible small changes are exhibited with subsequent increasing $\phi_G$.

Specifically, WSMs have non-trivial topological surface states that form intrinsic Fermi arcs. Here, Fermi arcs refers to an abnormal Fermi surface composed of an unclosed curve that starts from one-side Weil point separated from a dirac point and ends at the other-side Weil point.

That is, it can be confirmed that the cross-sectional area ($A_F$) corresponding to the β Fermi pocket in reference numeral 440 rapidly increases at $\phi_G=3.2\times10^{16}$ $cm^{-2}$. This is a phenomenon due to the phase transition of DSM into WSM.

On the other hand, a cross-sectional area ($A_F$) corresponding to the α Fermi pocket in reference numeral 440 does not exhibit a significant change according to $\phi_G$. This indicates that phase transition occurs only in the β Fermi pocket.

Meanwhile, it can be confirmed that phase shifts (ϕ) corresponding to the α Fermi pocket and β Fermi pocket in reference numeral 480 exhibit $\phi_G$-dependent characteristics different from other parameters according to quantum oscillation.

Specifically, it can be confirmed that the phase shifts (ϕ) corresponding to the α Fermi pocket and β Fermi pocket in reference numeral 480 gradually decrease as $\phi_G$ increases up to $12.8\times10^{16}$ $cm^{-2}$. Particularly, it can be confirmed that a decrease in the phase shift (ϕ) corresponding to the α Fermi pocket is smaller than a decrease in the phase shift (ϕ) corresponding to the β Fermi pocket.

From reference numeral 480, it can be confirmed that a phase shift (ϕ) value corresponding to the β Fermi pocket is about ±0.2. The phase shift (ϕ) value close to "0" is widely accepted in 3D DSM and WSM. The phase shift (ϕ) value of almost ‘0,’ which corresponds to the β Fermi pocket, shown in this study means that the berry phase becomes π, which is in good agreement with existing research results.

Meanwhile, changes (increase or decrease) in other parameters corresponding to the β Fermi pocket at $\phi_G$ $3.2\times10^{16}$ $cm^{-2}$ may be understood through simple physical considerations and the following several equations.

Specifically, frequency F may be understood from $F=(\hbar/2\pi e)A_F$, Dingle temperature ($T_D$) may be understood from $T_D=\hbar/2k_B\tau_Q$ Fermi wave vector ($k_F$) may be understood from $k_F=\sqrt{2eF/\hbar}$ Fermi level ($E_F$) may be understood from $E_F$ $(\hbar k_F)^2/m^*$, the mean free path ($I_Q$) may be understood from $I_Q=v_F\cdot\tau_Q$, Fermi velocity ($v_F$) may be understood from $v_F=\hbar k_F/m^*$, and the quantum mobility ($\mu_Q$) may be understood from $\mu_Q=e\tau_Q/m^*$.

From the results obtained using the equations, it can be confirmed that the α Fermi pocket of the DSM according to an embodiment still maintains the phase of DSM even by ion implantation.

FIGS. 5A to 5D are diagrams for explaining the electrical characteristics and Hall-effect characteristics of DSM according to an embodiment.

Referring to FIGS. 5A to 5D, reference numeral 510 illustrates electrical resistance (ρ) measurement results of the DSM according to an embodiment dependent upon the implantation fluence ($\phi_G$) of non-magnetic material ions and a temperature (T) change, and reference numeral 520 illustrates Hall resistance ($\rho_{Hall}$) measurement results of the DSM according to an embodiment dependent upon the implantation fluence ($\phi_G$) of non-magnetic material ions and a magnetic field (B) change.

In addition, reference numeral 530 illustrates Hall carrier density ($n_{Hall}$) measurement results dependent upon a change in the implantation fluence ($\phi_G$) of a non-magnetic material ions in α Fermi pocket and β Fermi pocket, and reference numeral 540 illustrates Hall mobility ($\mu_{Hall}$) measurement results dependent upon a change in the implantation fluence ($\phi_G$) of a non-magnetic material ions in α Fermi pocket and β Fermi pocket.

From reference numeral 510, electrical resistance (ρ) characteristics in a state in a magnetic field (B) is absent can be observed. Specifically, it can be confirmed that the electrical resistance (ρ) of DSM exhibits a temperature (T)-dependent increase regardless of $\phi_G$.

Hall resistance ($\rho_{Hall}$), Hall carrier density ($n_{Hall}$) and Hall mobility ($\mu_{Hall}$) characteristics corresponding to Fermi pocket and β Fermi pocket derived through Hall effect measurement can be respectively observed from reference numerals 520 to 540.

Specifically, it can be confirmed that the Hall carrier density ($n_{Hall}$) and Hall mobility ($\mu_{Hall}$) characteristics of the DSM according to an embodiment do not exhibit a rapid change, which is observed in the experimental processes through Raman scattering and quantum oscillation, at $\phi_G=3.2\times10^{16}$ $cm^{-2}$, but exhibit $\phi_G$-dependent changes (increase or decrease) in both the α Fermi pocket and the β Fermi pocket.

FIG. 6 illustrates a method of permanently phase-transiting DSM according to an embodiment.

In other words, FIG. 6 illustrates a method of phase-transiting the DSM according to an embodiment described with reference to FIGS. 1A to 5D. Hereinafter, detail description is provided with reference to FIG. 6, and the contents described above with reference to FIGS. 1A to 5D are omitted.

Referring to FIG. 6, in step 610 of the method of permanently phase-transiting DSM according to an embodiment, DSM may be formed.

According to an aspect, in step 610 of the method of permanently phase-transiting DSM according to an embodiment, a bismuth-antimony-based DSM represented by Formula 1 may be formed.

Preferably, in step 610 of the method of permanently phase-transiting DSM according to an embodiment, a $Bi_{0.96}Sb_{0.04}$ crystal with a high purity of 99.99% may be formed.

According to an aspect, in step 610 of the method of permanently phase-transiting DSM according to an embodiment, DSM may be formed by annealing a mixture of bismuth element (Bi) and antimony element (Sb) at 270° C. to 650° C.

Specifically, in step 610 of the method of permanently phase-transiting DSM according to an embodiment, a high-purity chemical mixture including bismuth element (Bi) and antimony element (Sb) may be contained and sealed in a vacuum tube so as to prevent oxidation of the mixture.

In addition, in step 610 of the method of permanently phase-transiting DSM according to an embodiment, the sealed mixture may be heated to 650° C., and the heated mixture is cooled to 270° C. over a first time, and then maintained (heated) at 270° C. for a second time, thereby forming a high-purity $Bi_{0.96}Sb_{0.04}$ crystal. For example, the first time may be 120 hours, and the second time may be 168 hours.

Next, in step 620 of the method of permanently phase-transiting DSM according to an embodiment, non-magnetic material ions are implanted into the formed DSM to induce permanent phase transition into WSM.

According to an aspect, in step 620 of the method of permanently phase-transiting DSM according to an embodiment, at least one non-magnetic material ion type of gold (Au) ions, silver (Ag) ions, copper (Cu) ions, tin (Sn) ions, titanium (Ti) ions, zinc (Zn) ions, palladium (Pd) ions, platinum (Pt) ions, ruthenium (Ru) ions, iridium (Ir) ions and indium (In) ions may be implanted into the formed DSM.

According to an aspect, in step 620 of the method of permanently phase-transiting DSM according to an embodiment, the non-magnetic material ion may be implanted in an implantation fluence of $3.2\times10^{16}$ $cm^{-2}$ to $12.8\times10^{16}$ $cm^{-2}$ into the formed DSM.

According to an aspect, the method of permanently phase-transiting DSM according to an embodiment may further include a step of annealing the phase transition-induced DSM at 230° C. for one hour under argon (Ar) flow to remove damage caused by ion implantation.

Meanwhile, a new Raman peaks, which did not previously exist, may be detected in a Raman shift range of $85.7\pm5$ $cm^{-1}$ of the Raman spectrum, obtained by the Raman spectroscopy method, of the DSM that was phase transition-induced by step 620.

In conclusion, inversion-symmetry breaking can be induced by implanting non-magnetic material ions (e.g., gold ions) into DSM according to the present disclosure, so that permanent phase transition of DSM into WSM can be realized.

As apparent from the above description, the present disclosure can induce the permanent phase transition of a dirac semimetal (DSM) by implanting non-magnetic material ions into DSM.

Although the present disclosure has been described with reference to limited embodiments and drawings, it should be understood by those skilled in the art that various changes and modifications may be made therein. For example, the described techniques may be performed in a different order than the described methods, and/or components of the described apparatuses, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

DESCRIPTION OF SYMBOLS

110: Raman spectrum of dirac semimetal dependent upon ion implantation fluence change

What is claimed is:

1. A method of permanently phase-transiting a dirac semimetal (DSM), the method comprising:

annealing a mixture of bismuth (Bi) and antimony (Sb) at a temperature of 270° C. to 650° C. to form a bismuth-antimony-based dirac semimetal (DSM) by $Bi_{1-x}Sb_x$ where x is a positive real number satisfying $0<x<1$, and implanting non-magnetic material ions into the formed DSM at an implantation fluence of $3.2\times10^{16}$ $cm^{-2}$ to $12.8\times10^{16}$ $cm^{-2}$ to induce a permanent phase transition of the DSM into a weyl semimetal (WSM).

2. The method according to claim 1, wherein, in the implanting, at least one non-magnetic material ion type of gold (Au) ions, silver (Ag) ions, copper (Cu) ions, tin (Sn) ions, titanium (Ti) ions, zinc (Zn) ions, palladium (Pd) ions, platinum (Pt) ions, ruthenium (Ru) ions, iridium (Ir) ions and indium (In) ions is implanted into the formed DSM.

3. The method according to claim 1, wherein a new Raman peak U (Bi), which did not previously exist, is detected in a Raman shift range of $85.7\pm5$ $cm^{-1}$ of Raman spectrum, obtained by Raman spectroscopy method, of the phase transition-induced DSM.

* * * * *